United States Patent [19]

Ohsawa

[11] 3,940,681
[45] Feb. 24, 1976

[54] WIDE AMPLITUDE RANGE DETECTING CIRCUIT

[75] Inventor: Mitsuo Ohsawa, Fujisawa, Japan

[73] Assignee: Sony Corporation, Tokyo, Japan

[22] Filed: Sept. 9, 1974

[21] Appl. No.: 504,290

[30] Foreign Application Priority Data
Sept. 10, 1973  Japan............................ 48-101894

[52] U.S. Cl. ................. 321/47; 307/253; 324/119; 328/26
[51] Int. Cl.² ......................................... H02M 7/12
[58] Field of Search ................. 307/253; 321/8, 47; 324/119; 328/26

[56] References Cited
UNITED STATES PATENTS

| | | | |
|---|---|---|---|
| 2,990,478 | 6/1961 | Scarbrough | 307/253 |
| 3,012,182 | 12/1961 | Ford | 321/47 |
| 3,143,664 | 8/1964 | Lourie et al. | 307/253 |
| 3,153,729 | 10/1964 | Leakey | 307/253 |
| 3,165,694 | 1/1965 | Young | 324/119 X |
| 3,170,074 | 2/1965 | Hill | 307/253 X |
| 3,196,338 | 7/1965 | Bahrs | 321/47 |
| 3,327,131 | 6/1967 | Grimmer | 307/253 X |
| 3,381,203 | 4/1968 | Mitchell | 321/47 X |
| 3,531,656 | 9/1970 | Ammann | 328/26 X |

*Primary Examiner*—William M. Shoop
*Attorney, Agent, or Firm*—Lewis H. Eslinger; Alvin Sinderbrand

[57] ABSTRACT

A detecting circuit with improved linearity of operation for small signal voltages. A rectifying transistor has switching means connected between its collector and base to be conductive when a signal voltage of one polarity is applied to the input circuit of the transistor and nonconductive when a signal voltage of the opposite polarity is applied. The rectified signal can be obtained from either the collector or emitter of the transistor.

10 Claims, 10 Drawing Figures

WIDE AMPLITUDE RANGE DETECTING CIRCUIT

BACKGROUND OF THE INVENTION

1. Field of the Invention

This invention relates to transistor detecting circuits and particularly to a circuit with switching means connected between the base and collector of the transistor to improve linearity of operation of the detecting circuit over a wide range of signal amplitudes.

2. Description of the Prior Art

Conventional transistorized detecting circuits consist, basically, of a detecting transistor having a base to which the input signal is applied by way of a capacitor and an emitter from which the rectified signal is obtained. In addition, a rectifying diode is connected to the base of the detecting transistor and has a polarity opposite to that of the base-emitter junction of the transistor. The other terminal of the diode is connected to a biasing source in the form of a second diode to add a voltage that corresponds to the forward voltage drop across the rectifying diode. The resulting voltage-doubled, rectified signal is obtained at the emitter output terminal of the circuit.

One disadvantage of the prior art detecting circuit is that, if a small signal voltage having a magnitude below the base-emitter voltage $V_{be}$ of the detecting transistor is applied to the input terminal of the circuit, the signal will be severely distorted. This is due to the fact that the threshold level of the diode cannot be selected to be equal to that of the detecting transistor. Accordingly, the dynamic range of amplitudes of signals from such a detecting circuit is very narrow, about 20 to 25db at most.

It is one of the objects of the present invention to provide an improved detecting circuit in which a transistor is utilized as the rectifying element and is so connected as to provide greater linearity of operation than transistor detecting circuits of the prior art.

It is another object of this invention to provide a detecting circuit having a wider dynamic range than was possible with previous detecting circuits.

A still further object of this invention is to provide a detecting circuit in which even signals of small amplitude may be detected substantially without distortion.

Other objects and advantages of the present invention will become clear from the detailed description of the preferred embodiments as illustrated with reference to the drawings.

SUMMARY OF THE INVENTION

In the present invention a transistor operating as a rectifier has signals to be detected connected to its base-emitter input circuit. Rectified output signals may be obtained in one polarity from the emitter of the transistor or, in the opposite polarity and with increased amplitude, from the collector. Switching means, such as a diode and particularly a Zener diode, is connected between the collector and the base of the transistor to control the operation thereof. The circuit may be connected with the transistor operating in either grounded emitter or grounded base configuration and with a capacitor connected in series with the base-emitter input circuit. Further a suitable biasing resistor may be connected in the emitter lead and a smoothing capacitor connected to the collector output terminal of the circuit.

In other embodiments of the circuit, additional fixed voltage means may be inserted in the emitter lead to provide suitable operating conditions for generating automatic gain control (AGC) voltage. Further, in accordance with the invention, the AGC voltage as used in a receiver may be amplified by a transistor circuit having both emitter and collector loads to derive oppositely directed AGC voltage signals. One of such signals may be applied across a voltage divider in the base circuit of a transistor, the gain of which is to be controlled and the other AGC signal may be applied to another transistor acting as a variable impedance in the base circuit of the controlled transistor to provide a double AGC effect to accommodate signals of widely varying amplitude.

DETAILED DESCRIPTION OF THE PREFERRED EMBODIMENTS

Figure 1:
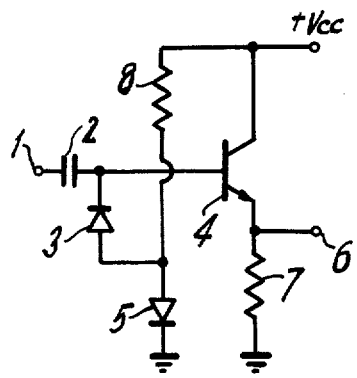
FIG. 1 is a schematic diagram of a prior art transistor rectifying circuit.

The rectifying circuit shown in FIG. 1 includes an input terminal 1 connected to a capacitor 2. The cathode of the diode 3 and the base of a recitfying transistor 4 are both connected to the capacitor 2. The anode of the diode is connected to the anode of another diode 5 that has its cathode connected to a reference voltage terminal, which, in this embodiment, is ground. An output terminal 6 is connected directly to the emitter of the transistor 4 and a resistor 7 is connected between the emitter and ground as an emitter load. A current limiting resistor 8 is connected between a positive power supply terminal +$V_{cc}$ and the juncture of the diodes 3 and 5.

The operation of the circuit in FIG. 1 may be considered first as if the diode 5 and the resistor 8 were not connected in the circuit but instead the anode of the diode 3 were connected directly to ground. During the negative half cycle of alternating voltage applied to the circuit between the terminal 1 and ground, the voltage across the capacitor 2 would be equal to ($V_a - V_d$), wherein $V_a$ represents the amplitude of the negative half cycle of the applied voltage, and $V_d$ is the forward voltage of the diode. During the positive half cycle, the input current flows through the capacitor 2 and the base-emitter circuit of the transistor so that a rectified signal is obtained at the output terminal 6. The input signal voltage is biased by the voltage ($V_a - V_d$) across the capacitor 2 so that a voltage having an amplitude almost twice the value of the input signal will be present at the output terminal 6.

However, in such a detecting circuit, the diode forward voltage $V_d$ is always subtracted from the input voltage $V_a$. Consequently, it is almost impossible to rectify a small signal voltage having a value below the base-emitter voltage $V_{be}$ of the transistor 4. It is to correct such distortion that the compensating diode 5 is provided in the rectifying circuit in FIG. 1 to give a bias voltage $V_d$ to the rectifying diode 3. As a result, a rectified output signal below the voltage level $V_d$ can be obtained at the output terminal 6 in response to small-amplitude signals applied to the input terminal 1.

It is difficult to achieve results as satisfactory as may be desired with such a circuit because it is difficult to arrange for the forward voltage $V_d$ of the diodes 3 and 5 to coincide with the base-emitter voltage $V_{be}$ of the rectifying transistor 4. Accordingly, the circuit does not operate as well as may be desired when the input signal is very small. The distortion of the rectified signal of such low level is quite high.

Figure 2:
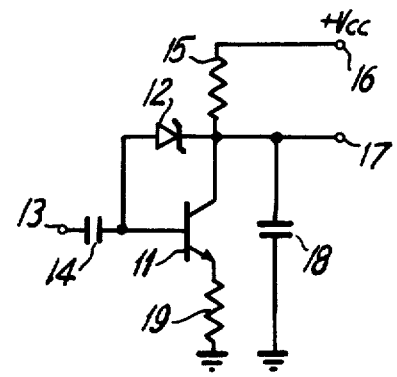
FIG. 2 is a schematic diagram of a basic rectifying circuit according to the present invention.

The present invention improves the linearity of the detecting circuit by means of the circuit shown in FIG. 2. In the latter circuit a detecting transistor 11 has a constant voltage diode, such as a Zener diode, 12 connected between its base and collector. The signal to be rectified is applied to an input terminal 13 connected by a capacitor 14 to the base of the transistor 11. The transistor has a collector load resistor 15 connected between the collector and the positive power supply terminal 16 having a voltage $+V_{cc}$. An output terminal 17 is connected to the collector of the transistor 11, and a capacitor 18 is connected between the collector and ground. An emitter biasing resistor 19 is connected between the emitter of the transistor and ground.

Figure 3:
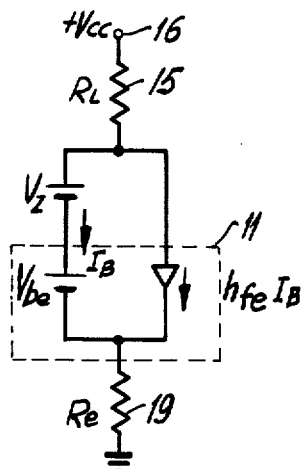
FIG. 3 is an equivalent circuit corresponding to the circuit in FIG. 2.

The operation of the detecting circuit in FIG. 2 will be described with reference to an equivalent circuit shown in FIG. 3. In these circuits the following relationships are given:

$$V_{cc} = (R_L + R_e)(1 + h_{fe})I_B + V_z + V_{be} \quad (1)$$
$$V_c = V_{cc} - R_L(1 + h_{fe})I_B \quad (2)$$

wherein $V_{cc}$ is the power supply voltage at the terminal 16, $R_L$ and $R_e$ are values of the resistors 15 and 19, respectively, $I_B$ is the base current of the transistor 11, $V_{be}$ is the base-emitter voltage of the transistor 11, $V_z$ is the Zener voltage of the Zener diode 12, $V_c$ is the collector voltage of the transistor 11 with respect to ground, and $h_{fe}$ is the current amplification factor of the transistor 11.

From the equation (1), the base current $I_B$ is derived as:

$$I_B = \frac{V_{cc} - V_z - V_{be}}{(1 + h_{fe})(R_L + R_e)} \quad (3)$$

By substituting equation (3) into equation (2), the following relation is obtained:

$$V_c = \frac{R_e}{R_L + R_e} V_{cc} + \frac{R_L}{R_L + R_e}(V_z + V_{be}) \quad (4)$$

If $R_e \ll R_L$,
$$V_c \approx V_z + V_{be} \quad (5)$$

This means that when the Zener diode 12 is conductive, the collector potential of the transistor 11 will be kept at a fixed voltage.

In order to understand the AC operation of the circuit in FIG. 2, let it be assumed that the base potential of the transistor 11 is designated to be equal to the Zener diode voltage $V_z$ of the Zener diode 12 by selecting a suitable resistance value for the resistor 19.

Figure 4A:
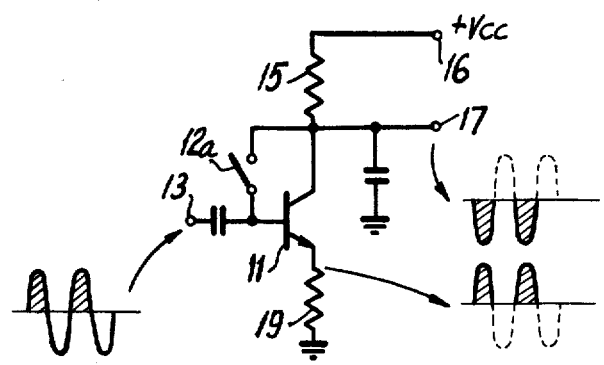
FIG. 4A is a circuit equivalent to that in FIG. 2 under one operating condition.

The diode 12 performs the switching operation in response to an input signal applied between the input terminal 13 and ground. During the positive half cycle of the input signal, the impedance of the diode 12 has an extremely high value in the range of several hundred kilohms. This is the same as saying that the diode 12 is in a substantially cutoff state. In that state, the diode 12 may be represented by an open-circuited switch as shown in FIG. 4A. The waveforms associated with FIG. 4A represent the fact that the positive half cycles of a sinusoidal input signal applied to the terminal 13 produce a halfwave rectified signal of one polarity at the output terminal 17 and of the opposite polarity at the emitter of the transistor 11.

Figure 4B:
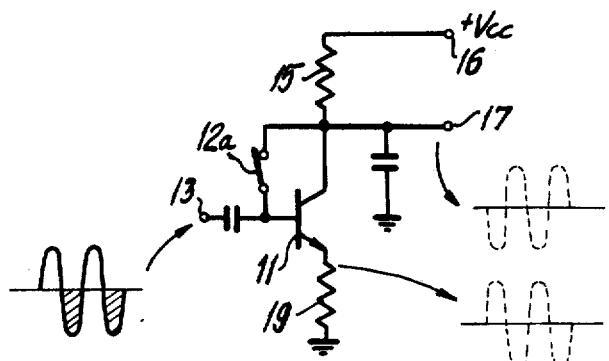
FIG. 4B is a circuit equivalent to that in FIG. 2 under the opposite operating condition.

During the negative half cycles of the input signal applied to the input terminal 13, the diode 12 becomes conductive and its impedance drops to a very low value, for example, less than 100 ohms. This condition is represented in FIG. 4B and the shaded negative half cycles of the sinusoidal input signal are indicated as producing no output signal either at the terminal 17 or at the emitter of the transistor 11.

Accordingly, during the positive half cycles of the input signal, and assuming that the current amplification factor $h_{fe}$ is much greater than 1, the voltage gain $A_v$ in the detecting circuit is:

$$A_v = -\frac{R_L}{R_e} \quad (6)$$

This means that the signal during the positive half cycles is amplified by the transistor 11 and is available at the terminal 17 in the opposite polarity to the signal at the input terminal 13.

Figure 5:
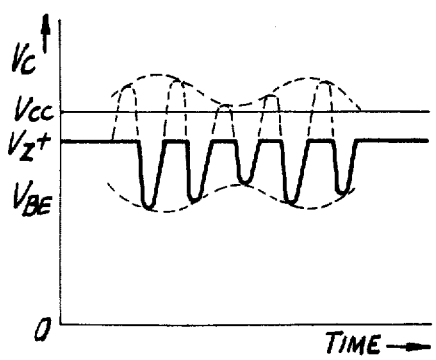
FIG. 5 is a waveform diagram of a rectified output signal of the circuit in FIG. 2.

As shown in FIG. 4B, during the negative half cycle of the input signal to the terminal 13, a full negative feedback loop is formed by the diode 12 so that the voltage gain $A_v$ is reduced substantially to zero. In addition, in order for the diode 12 to become conductive, the terminal 17 must maintain a constant voltage of $(V_z + V_{be})$. The resulting waveform at the terminal 17 is shown in FIG. 5. The waveform represents the rectified signal that results from applying an amplitude modulated signal to the input terminal 13. The waveform in FIG. 5 still contains half cycle components of the high frequency carrier wave, but may be smoothed out by the capacitor 18. As described above, the detecting action of the circuit according to the present invention is performed by utilizing the Zener characteristic of the diode 12 so that, even if a small voltage is applied to the input terminal 13, a rectified signal can be obtained substantially without distortion. The knee of the Zener characteristic is quite sharp and the response of the diode is linear. The detecting circuit has good linearity over a wide range, and as a result, the dynamic range of amplitudes of signals to which the circuit can respond is quite wide. In addition, the resistor 19 is connected to the emitter of the transistor 11 to apply negative feedback to the transistor, which further reduces distortion in the detected signal and improves the stability of the detecting circuit. It has been determined experimentally that the detecting circuit shown in FIG. 2 is capable of providing rectified signals having a dynamic range of about 35 to 40db.

Figure 6:
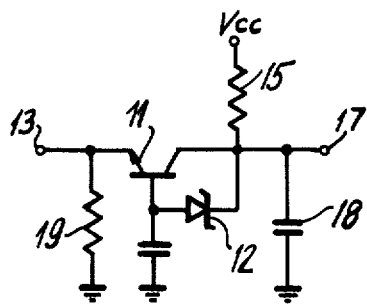
FIG. 6 is a different embodiment of a transistor rectifying circuit according to the present invention.

FIG. 6 shows another embodiment of the invention in which the transistor 11 is connected as a common base circuit. As is known in the art, the common base configuration presents a low impedance so that this circuit is particularly suitable for use with an impedance-matching circuit using a transformer. In this figure the capacitor 14 is connected between the base of the transistor 11 and ground, but is still in the base-emitter input circuit of the transistor between the input terminal 13 and ground. The operation of the circuit in FIG. 6 is the same as the circuit in FIG. 2 and is equally capable of providing linear rectification response to signals of a wide range of amplitudes applied to the input terminal 13.

Figure 7:
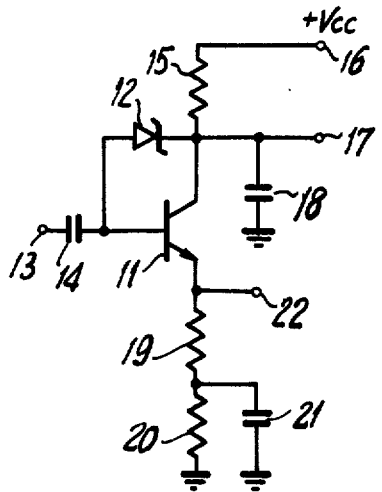
FIGS. 7 and 8 are further embodiments of the invention.
Figure 8:
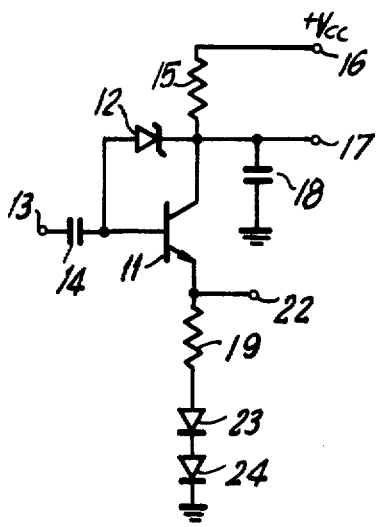

The circuits in FIGS. 7 and 8 are also similar to the circuit in FIG. 2 except that the circuit in FIG. 7 includes a parallel RC circuit comprising a resistor 20 and a capacitor 21 between the resistor 19 and ground. The circuit also has an output terminal 22 connected to the emitter of the transistor 11. The circuit in FIG. 8 includes two series-connected diodes 23 and 24 in place of the parallel RC circuit in FIG. 7. In each case, the circuit components between the lower end of the resistor 19 and ground provide a relatively fixed voltage, and the AGC signal may be derived from the output terminal 22. It is possible to use the relatively fixed voltage at the lower end of the resistor 19, particularly in the circuit in FIG. 8, as a bias voltage source for other parts of a system in which the rectifying circuit of the present invention is only a part.

Figure 9:
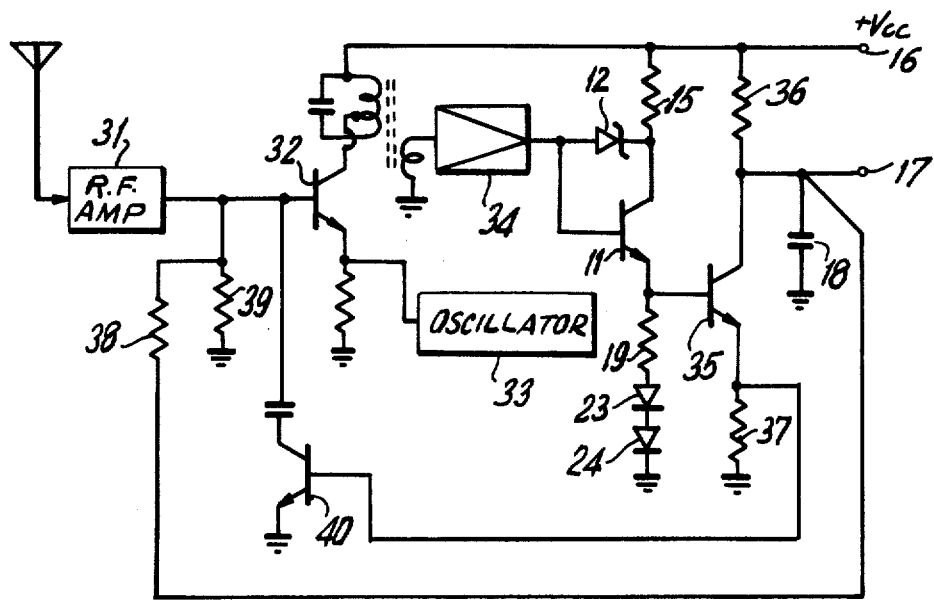
FIG. 9 shows a circuit diagram partly in block form and partly in schematic form of the input section and AGC circuit for a receiver.

FIG. 9 shows the rectifying circuit of the present invention in a typical application in a receiver. The received signal is amplified by a radio frequency (RF) amplifier 31 and applied to the base of a mixer transistor 32. A signal from a local oscillator 33 is connected to the emitter of the transistor 32 to inject the oscillator signal into the transistor in order to convert the RF signal to an intermediate frequency (IF) at the collector of transistor 32. The IF signal is filtered and applied to an IF amplifier 34 which is connected, in turn, to the detecting circuit of the present invention. The base of the detecting transistor 11 is connected to the output of the IF amplifier 34 and the Zener diode 12 is connected, as before, between the collector and base of the transistor 11.

The output of the detecting transistor 11 is obtained from the emitter and across the circuit comprising the resistor 19 and the diodes 23 and 24. The emitter of the transistor 11 is connected directly to the base of another transistor 35 that has a collector load resistor 36 and an emitter load resistor 37. The collector of the transistor 35 is directly connected to the output terminal 17 of the circuit, and the smoothing capacitor 18 is connected between the output terminal 17 and ground. The collector of the transistor 35 is also connected to a voltage divider that includes a resistor 38 and another resistor 39. The latter resistor is connected between the base of the transistor 32 and ground. The emitter of the transistor 35 is connected to the base of a transistor 40 that furnishes a variable impedance in accordance with the amplitude of the signal at the emitter of the transistor 35. For AC purposes the emitter-collector circuit of the transistor 40 is effectively connected between the base of the transistor 32 and ground and is in parallel with the resistor 39 in the voltage divider.

When the circuit in FIG. 9 is in operation and a signal of a certain amplitude is supplied to the RF amplifier 31, the rectifier transistor 11 will have a certain output signal at its emitter and this output signal will cause a voltage drop across the load resistors 36 and 37. By virtue of the output voltage at the collector of the transistor 35, the voltage divider comprising the resistors 38 and 39 and the emitter-collector circuit of the transistor 40 will be energized by a certain AGC signal voltage. The impedance of the emitter-collector circuit of the transistor 40 will be determined by the output voltage at the emitter of the transistor 35.

When the amplitude of the received signal applied to the RF amplifier 31 increases, there is a corresponding increase in the amplitude of the signal applied to the base of the transistor 11. This causes an increase in the level of the rectified AGC signal at the emitter of the transistor 11, which, in turn, causes an increase in the voltage level at the emitter of the transistor 35 and a decrease in the voltage level at the collector. The decreased voltage at the collector reduces the voltage across the voltage divider and thus, reduces the voltage between the base of the transistor 32 and ground. At the same time, the increase in voltage level at the emitter of the transistor 35 causes the transistor 40 to become more conductive and thus, to change the voltage division ratio of the voltage divider in such a way as to decrease still further the bias level on the base of the transistor 32. This further reduces the gain of the transistor 32.

On the other hand, when the signal applied to the RF amplifier 31 diminishes from its normal value, the voltage applied across the voltage divider increases and the impedance of the transistor 40 decreases. These two effects work together to increase the gain of the transistor 32. By controlling the gain of the transistor 32 by two AGC signals working together, the range of signal amplitudes that can be handled by the circuit is much increased over what would be possible if there were only one AGC circuit affecting the operation of the transistor 32.

While the switching means shown in the various embodiments of this invention are indicated as a Zener diode 12, it is possible to use other switching elements, such as a diode-connected transistor or a ZNR semiconductor device instead of the diode 12. Further modifications may be made in this invention without departing from the true scope thereof.

What is claimed is:

1. A detecting circuit comprising:
   A. a rectifying transistor comprising a base, an emitter, and collector, said base and emitter comprising components of a base-emitter input circuit to receive an input signal to be rectified, and said collector and said emitter comprising parts of an output circuit;
   B. Zener diode switching means connected directly in series between said collector and said base, and controlled by said input signal to be conductive when said input signal has a polarity that tends to make said transistor conductive and to be non-conductive when said input signal has the opposite polarity; and
   C. an output terminal connected to said output circuit to derive therefrom a rectified signal corresponding to said input signal.

2. The detecting circuit of claim 1 comprising a collector load resistor, said output terminal being connected to the juncture of said switching means and said collector.

3. The detecting circuit of claim 2 comprising, in addition, an emitter resistor connected in series between said emitter and a reference voltage terminal, the resistance of said resistor being such that the bias voltage on the base of said transistor is substantially equal to the Zener diode voltage of said diode.

4. The detecting circuit of claim 3 comprising, in addition, an input terminal and a capacitor connected in series with said base-emitter circuit, said input signal being applied across said input terminal and said reference voltage terminal.

5. The detecting circuit of claim 4 in which said input terminal is connected to said emitter, and said capacitor is connected in series between said base and said reference voltage terminal.

6. The detecting circuit of claim 4 in which said capacitor is connected in series between said input terminal and said base.

7. The detecting circuit of claim 6 comprising, in addition, substantially fixed voltage drop means connected in series between said emitter resistor and said reference voltage terminal.

8. The detecting circuit of claim 7 in which said fixed voltage drop means comprises a parallel circuit comprising a third resistor and a capacitor.

9. The detecting circuit of claim 7 in which said fixed voltage drop means comprises diode means polarized to conduct current flowing through the emitter-collector circuit of said transistor.

10. The combination comprising:
A. a detecting circuit comprising:
(1) a rectifying transistor comprising a base, an emitter, and collector, said base and emitter comprising components of an input circuit to receive an input signal to be rectified, and said collector and said emitter comprising parts of an output circuit, and
(2) switching means connected between said collector and said base, and controlled by said input signal to have a first conductivity condition when said input signal has one polarity and to have the opposite conductivity condition when said input signal has the opposite polarity;
B. a second transistor, the gain of which is to be controlled;
C. a third transistor, the base of said third transistor being connected to the emitter of said rectifying transistor to be receive a rectified signal therefrom, the emitter and collector of said third transistor comprising first and second rectified signal output terminals;
D. a voltage divider comprising first and second impedances connected to one of said rectified signal output terminals to be energized thereby, the base of said second transistor being connected to the juncture between said first and second impedances and being connected to a high frequency signal source, said second impedance being controllable by a control voltage; and
E. a connection between the other of said rectified signal output terminals and said variable impedance to control the magnitude thereof, whereby the gain of said second transistor is controlled by the magnitude of the voltage applied across said voltage divider and is inversely controlled by the magnitude of the voltage controlling said controllable impedance.

* * * * *